United States Patent
Uhrich et al.

(10) Patent No.: US 10,756,284 B2
(45) Date of Patent: Aug. 25, 2020

(54) PHOTOACTIVE COMPONENT HAVING ORGANIC LAYERS

(75) Inventors: Christian Uhrich, Dresden (DE); Bert Männig, Dresden (DE); Gregor Schwartz, East Palo Alto, CA (US)

(73) Assignee: HELIATEK GMBH (DE)

(*) Notice: Subject to any disclaimer, the term of this patent is extended or adjusted under 35 U.S.C. 154(b) by 0 days.

(21) Appl. No.: 13/516,583

(22) PCT Filed: Dec. 15, 2010

(86) PCT No.: PCT/EP2010/069679
§ 371 (c)(1),
(2), (4) Date: Aug. 21, 2012

(87) PCT Pub. No.: WO2011/073219
PCT Pub. Date: Jun. 23, 2011

(65) Prior Publication Data
US 2012/0312364 A1    Dec. 13, 2012

(30) Foreign Application Priority Data
Dec. 16, 2009 (DE) .......... 10 2009 058 635

(51) Int. Cl.
| | |
|---|---|
| H01L 51/44 | (2006.01) |
| H01L 51/42 | (2006.01) |
| H01L 27/30 | (2006.01) |
| H01L 51/52 | (2006.01) |

(52) U.S. Cl.
CPC ......... H01L 51/448 (2013.01); H01L 51/442 (2013.01); H01L 27/302 (2013.01); H01L 51/424 (2013.01); H01L 51/5253 (2013.01); Y02E 10/549 (2013.01); Y02P 70/521 (2015.11)

(58) Field of Classification Search
USPC ........................................... 136/263
See application file for complete search history.

(56) References Cited

U.S. PATENT DOCUMENTS

| | | | |
|---|---|---|---|
| 5,093,698 A | 3/1992 | Egusa | |
| 6,300,612 B1 | 10/2001 | Yu | |
| 6,420,031 B1 * | 7/2002 | Parthasarathy et al. | ... 428/411.1 |
| 6,559,375 B1 | 5/2003 | Meissner et al. | |
| 6,657,378 B2 * | 12/2003 | Forrest et al. | ............... 313/503 |
| 6,908,783 B1 | 6/2005 | Kuehl et al. | |

(Continued)

FOREIGN PATENT DOCUMENTS

| | | |
|---|---|---|
| DE | 103 38 406 | 8/2003 |
| DE | 103 47 856 | 10/2003 |

(Continued)

OTHER PUBLICATIONS

Author Unknown, Zinc-Phthalocyanine MSDS, 2014.*

(Continued)

*Primary Examiner* — Eli S Mekhlin
(74) *Attorney, Agent, or Firm* — Ostrolenk Faber LLP (57) ABSTRACT

The description relates to an organic photoactive component, in particular an organic solar cell, having an electrode on the substrate and a top counter-electrode and a doped transport layer between the electrodes and a photoactive layer system, characterized in that a metal oxide layer is present between the photoactive system and the top counter-electrode.

15 Claims, 3 Drawing Sheets

(56) References Cited

U.S. PATENT DOCUMENTS

| | | | |
|---|---|---|---|
| 7,151,007 | B2 | 12/2006 | Werner et al. |
| 7,675,057 | B2 | 3/2010 | Drechsel et al. |
| 2002/0017612 | A1 | 2/2002 | Yu et al. ............... 250/370.11 |
| 2004/0016923 | A1 | 1/2004 | Yu et al. ............... 257/49 |
| 2004/0094771 | A1* | 5/2004 | Bernds et al. ............... 257/100 |
| 2005/0110005 | A1 | 5/2005 | Forrest et al. |
| 2006/0027834 | A1* | 2/2006 | Forrest et al. ............... 257/183 |
| 2006/0059705 | A1 | 3/2006 | Wang et al. |
| 2006/0246293 | A1* | 11/2006 | Iizumi et al. ............... 428/411.1 |
| 2006/0278890 | A1* | 12/2006 | Brabec ............... B82Y 10/00 257/186 |
| 2007/0040161 | A1* | 2/2007 | Kumaki et al. ............... 257/13 |
| 2007/0090371 | A1* | 4/2007 | Drechsel et al. ............... 257/79 |
| 2007/0221926 | A1* | 9/2007 | Lee et al. ............... 257/79 |
| 2007/0278479 | A1 | 12/2007 | Werner et al. |
| 2008/0224605 | A1* | 9/2008 | Noh et al. ............... 313/504 |
| 2008/0236657 | A1 | 10/2008 | Brabec et al. |
| 2009/0126779 | A1* | 5/2009 | Heeger et al. ............... 136/249 |
| 2009/0199903 | A1* | 8/2009 | Oyamada et al. ............... 136/263 |
| 2009/0212280 | A1 | 8/2009 | Werner et al. |
| 2009/0217980 | A1 | 9/2009 | Pfeiffer et al. |
| 2009/0242030 | A1* | 10/2009 | Kirschner et al. ............... 136/260 |
| 2009/0255586 | A1* | 10/2009 | Kim et al. ............... 136/263 |
| 2009/0294761 | A1* | 12/2009 | Kim ............... H01L 51/424 257/40 |
| 2010/0084011 | A1* | 4/2010 | Forrest et al. ............... 136/255 |
| 2010/0331509 | A1* | 12/2010 | Zhang et al. ............... 526/259 |
| 2011/0101479 | A1* | 5/2011 | Arango ............... H01L 31/0352 257/431 |

FOREIGN PATENT DOCUMENTS

| | | |
|---|---|---|
| DE | 103 57 044 | 12/2003 |
| DE | 10 2004 010 954 | 3/2004 |
| DE | 10 2004 014 046 | 3/2004 |
| DE | 10 2006 053 320 | 11/2006 |
| DE | 10 2006 054 524 | 11/2006 |
| DE | 10 2008 051 737 | 10/2008 |
| EP | 0 000 829 | 1/1982 |
| EP | 2 256 839 | 12/2010 |
| WO | WO 2004/083958 | 9/2004 |
| WO | WO 2006/092134 | 9/2006 |
| WO | WO 2009/153328 | 12/2009 |

OTHER PUBLICATIONS

International Search Report dated Feb. 1, 2011 issued in corresponding international patent application No. PCT/EP2010/069679.

Cattin, L. et al.: "MoO3 surface passivation of the transport anode in organic solar cells using ultrathin films", Journal of Applied Physics 105, 034507 (2009).

Drechsel, J. Et al.: "MIP-type organic solar cells incorporating phthalocyanine/fullerene mixed layers and doped wide-gap transport layers", Org. Electron. 5, p. 175 (2004).

Drechsel, J. Et al.: "Organic MIP-diodes by p-doping of amorphous wide-gap semiconductors: CV and impedance spectroscopy", Synthet. Metal. 127, pp. 201-205 (2002).

Hiramoto, Masahiro et al.: "Effect of thin gold interstitial-layer on the photovoltaic properties of tandem organic solar cell", Chem. Lett., 1990, 327-330 (1990).

Hiramoto, Masahiro et al.: "Organic Solar Cells incorporating a p-i-n junction", Mol. Cryst., 2006, 444, pp. 33-40.

Hiramoto, Masahiro et al.: "Three-layered organic solar cell with a photoactive interlayer of codeposited pigments", Appl. Phys. Lett. 58, 1062-1064 (1991).

Kim, Do Young et al.: "The effect of molybdenum oxide interlayer on organic photovoltaic cells", Applied Physics Letters 95, 093304 (2009).

Pfeiffer, Martin: "Controlled doping of organic vacuum deposited dye layers: basics and applications", Ph.D. thesis TU Dresden; 1999.

Rusu, M. Et al.: "Fine tailored interpenetrating donor-acceptor morphology by OVPD for organic solar cells", Thin Solid Films 516, pp. 7160-7166 (2008).

Tang, Ching W.: "Two Layer Organic Photovoltaic Cell", Appl. Phys. Lett. 48, 183 (1986).

International Preliminary Examination Report on Patentability and Written Opinion of the International Searching Authority dated Jul. 12, 2012 in corresponding International Application No. PCT/EP2010/069679 (English translation).

Cattin, L. et al., "MoO$_3$ surface passivation of the transparent anode in organic solar cells using ultrathin films," Journal of Applied Physics 105, 034507 (2009).

\* cited by examiner

PHOTOACTIVE COMPONENT HAVING ORGANIC LAYERS

CROSS-REFERENCE TO RELATED APPLICATIONS

The present application is a 35 U.S.C. §§ 371 national phase conversion of PCT/EP2010/069679, filed Dec. 15, 2010, which claims priority of German Application No. 10 2009 058 635.0, filed Dec. 16, 2009, the contents of which are incorporated by reference herein. The PCT International Application was published in the German language.

The invention relates to an organic photoactive component, specifically an organic solar cell, comprising one electrode on the substrate and a top counterelectrode and a doped transport layer and a photoactive layer system between the electrodes, characterized in that a metal oxide layer is situated between the photoactive system and the top counterelectrode.

BACKGROUND OF THE INVENTION

Since the demonstration of the first organic solar cell having an efficiency in the percent range by Tang et al. 1986 [C. W. Tang et al. Appl. Phys. Lett. 48, 183 (1986)], organic materials have been investigated intensively for various electronic and optoelectronic components. Organic solar cells consist of a sequence of thin layers (typically 1 nm to 1 μm) composed of organic materials, which are preferably applied by vapor deposition in a vacuum or by spin-coating from a solution. The electrical contact-connection can be effected by metal layers, transparent conductive oxides (TCOs) and/or transparent conductive polymers (PEDOT-PSS, PANI).

A solar cell converts light energy into electrical energy. In this case, the term photoactive likewise denotes the conversion of light energy into electrical energy. In contrast to inorganic solar cells, in organic solar cells the light does not directly generate free charge carriers, rather excitons initially form, that is to say electrically neutral excitation states (bound electron-hole pairs). It is only in a second step that these excitons are separated into free charge carriers which then contribute to the electric current flow.

The advantage of such organic-based components over the conventional inorganic-based components (semiconductors such as silicon, gallium arsenide) are the in some instances extremely high optical absorption coefficients (up to $2 \times 10^5$ cm$^{-1}$), thus affording the possibility of producing very thin solar cells with little outlay in terms of material and energy. Further technological aspects include the low costs, the possibility of producing flexible large-area components on plastic films, and the virtually unlimited possibilities for variation and the unlimited availability of organic chemistry.

One possibility for the realization of an organic solar cell that has already been proposed in the literature consists in a pin diode [Martin Pfeiffer, "Controlled doping of organic vacuum deposited dye layers: basics and applications", PhD thesis TU-Dresden, 1999] having the following layer construction:

0. carrier, substrate,
1. bottom contact, normally transparent,
2. p-layer(s),
3. i-layer(s),
4. n-layer(s),
5. top contact.

In this case, n and p denote an n-type and p-type doping, respectively, which lead to an increase in the density of free electrons and holes, respectively, in the thermal equilibrium state. However, it is also possible for the n-layer(s) and p-layer(s) to be at least in part nominally undoped and to have preferably n-conducting and preferably p-conducting properties, respectively, only on account of the material properties (e.g. different mobilities), on account of unknown impurities (e.g. residual residues from the synthesis, decomposition or reaction products during the layer production) or on account of influences of the surroundings (e.g. adjacent layers, indiffusion of metals or other organic materials, gas doping from the surrounding atmosphere). In this sense, layers of this type should primarily be understood as transport layers. By contrast, the designation i-layer denotes a nominally undoped layer (intrinsic layer). In this case, one or a plurality of i-layers can consist layers either composed of one material, or a mixture composed of two materials (so-called interpenetrating networks or bulk heterojunction; M. Hiramoto et al. Mol. Cryst. Liq. Cryst., 2006, 444, pp. 33-40). The light incident through the transparent bottom contact generates excitons (bound electron-hole pairs) in the i-layer or in the n-/p-layer. Said excitons can only be separated by very high electric fields or at suitable interfaces. Sufficiently high fields are not available in organic solar cells, with the result that all promising concepts for organic solar cells are based on the separation of excitons at photoactive interfaces. The excitons pass by diffusion to such an active interface, where electrons and holes are separated from one another. In this case, the material which takes up the electrons is designated as acceptor, and the material which takes up the hole is designated as donor. The separating interface can lie between the p- (n-) layer and the i-layer or between two i-layers. In the built-up electric field of the solar cell, the electrons are then transported away to the n-region and the holes to the p-region. Preferably, the transport layers are transparent or largely transparent materials having a large band gap (wide-gap) such as are described e.g. in WO 2004083958. In this case, the term wide-gap materials denotes materials whose absorption maximum lies in the wavelength range of <450 nm, and is preferably <400 nm.

Since the light always generates excitons first, and does not yet generate free charge carriers, the diffusion of excitons to the active interface with little recombination plays a critical part in organic solar cells. In order to make a contribution to the photocurrent, it is necessary, therefore, in a good organic solar cell, for the exciton diffusion length to distinctly exceed the typical penetration depth of the light, in order that the predominant part of the light can be utilized. Organic crystals or thin layers that are perfect structurally and with regard to chemical purity do indeed fulfill this criterion. For large-area applications, however, the use of monocrystalline organic materials is not possible and the production of multilayers with sufficient structural perfection is still very difficult to date.

If the i-layer is a mixed layer, then the task of light absorption is undertaken by either only one of the components or else both. The advantage of mixed layers is that the excitons generated only have to cover a very short path until they reach a domain boundary, where they are separated. The electrons and holes are respectively transported away separately in the respective materials. Since the materials are in contact everywhere with one another in the mixed layer, what is crucial in the case of this concept is that the separated charges have a long lifetime on the respective material and closed percolation paths for both types of charge carriers toward the respective contact are present from every location.

U.S. Pat. No. 5,093,698 discloses the doping of organic materials. By admixing an acceptor-like or donor-like doping substance, the equilibrium charge carrier concentration in the layer is increased and the conductivity is increased. According to U.S. Pat. No. 5,093,698, the doped layers are used as injection layers at the interface with respect to the contact materials in electroluminescent components. Similar doping approaches are analogously expedient for solar cells as well.

The literature discloses various possibilities for realization for the photoactive i-layer. Thus, the latter can be a double layer (EP0000829) or a mixed layer (Hiramoto, Appl. Phys. Lett. 58, 1062 (1991)). A combination of double and mixed layers is also known (Hiramoto, Appl. Phys. Lett. 58, 1062 (1991); U.S. Pat. No. 6,559,375). It is likewise known that the mixing ratio differs in different regions of the mixed layer (US 20050110005), or the mixing ratio has a gradient.

Furthermore, tandem and multiple solar cells are known from the literature (Hiramoto, Chem. Lett., 1990, 327 (1990); DE 102004014046).

Organic tandem solar cells have already long been known from the literature (Hiramoto, Chem. Lett., 1990, 327 (1990). In the tandem cell from Hiramoto et al., a 2 nm thick gold layer is situated between the two single cells. The task of said gold layer consists in providing for a good electrical connection between the two single cells: the gold layer brings about an efficient recombination of the holes from one subcell with the electrons from the other subcell and thus has the effect that the two subcells are electrically connected in series. Furthermore, like any thin metal layer (or metal cluster) the gold layer absorbs part of the incident light. This absorption is a loss mechanism in the tandem cell from Hiramoto since less light is thereby available to the photoactive layers (H2Pc (metal-free phthalocyanine)/Me-PTC (N,N"-dimethylperylene-3,4,9,10-bis(dicarboximide) in the two single cells of the tandem cell. In this tandem structure, therefore, the task of the gold layer is purely on the electrical side. Within this conception, the gold layer should be as thin as possible or completely omitted in the best case.

Furthermore, the literature discloses organic pin-tandem cells (DE 102004014046): the structure of such a tandem cell consists of two pin single cells, wherein the layer sequence "pin" describes the succession of a p-doped layer system, an undoped photoactive layer system and an n-doped layer system. The doped layer systems preferably consist of transparent materials, so-called wide-gap materials/layers, and in this case they can also be partly or wholly undoped or else have in a location-dependent manner different doping concentrations or have a continuous gradient in the doping concentration. Especially even very lightly doped or highly doped regions in the boundary region at the electrodes, in the boundary region with respect to some other doped or undoped transport layer, in the boundary region with respect to the active layers or in the case of tandem or multiple cells in the boundary region with respect to the adjacent pin- or nip-subcell, i.e. in the region of the recombination zone, are possible. Any desired combination of all these features is also possible. Of course, such a tandem cell can also be a so-called inverted structure (e.g. nip-tandem cell. All these possible forms of realization for tandem cells are designated by the term pin-tandem cells hereinafter. One advantage of such a pin-tandem cell consists in the fact that the use of doped transport layers enables a very simple and at the same time very efficient possibility of realization for the recombination zone between the two subcells. The tandem cell has e.g. a pinpin-structure (or else e.g. possibly nipnip). An n-doped layer and a p-doped layer are respectively situated at the interface between the two pin-subcells, and form a pn-system (or np-system). A very efficient recombination of the electrons and holes takes place in such a doped pn-system. The stacking of two pin single cells thus directly produces a complete pin tandem cell, without still further layers being required. It is especially advantageous here that thin metal layers, as in the case of Hiramoto, are no longer required in order to ensure efficient recombination. As a result, the loss absorption of such thin metal layers can be completely avoided.

The central problem in optimizing the efficiency of tandem cells consists in the fact that both subcells are intended to generate as far as possible an identical amount of photocurrent. Since highly efficient organic solar cells have a high internal quantum efficiency (almost all photons are converted into electric current), this means that both subcells are intended to absorb light (i.e. number of photons) of the solar spectrum as identically as possible. This is because if one subcell absorbs more light than the other subcell, then the first subcell could actually generate a larger photocurrent than the second subcell. Since the two subcells are electrically connected in series in the tandem cell, however, the current of the tandem cell is always limited by the lower current of one of the two subcells. The potentially larger current of a subcell that absorbs more light thus has to remain unused. Tandem cells therefore have to be optimized such that both subcells absorb as much light as possible and absorb an identical amount of light.

The absorption can be balanced e.g. via the variation of the thicknesses of the two photoactive layer systems. A further possibility in the case of pin-tandem cells consists in positioning the photoactive layer systems in the maxima of the optical field distribution of the light by means of the variation of the thicknesses of the transport layers (this is likewise described in DE 102004014046).

However, the possibilities for adaptation by means of these two methods mentioned are restricted or associated with loss: thus, in a tandem cell, for example, equality of absorption can be achieved by virtue of the fact that, in the "better" subcell, the thickness of the photoactive system is reduced and this subcell therefore absorbs less light, namely just as much as the other subcell. Consequently, although the tandem cell has nominally been optimized, this has also only lead to the fact that the "weaker" subcell in turn limits the component and the potential of the "better" subcell cannot be used. Furthermore, tandem cells which are intended to have a high efficiency have to comprise different absorber systems, i.e. the two subcells contain a plurality of different absorber materials and absorb partly or wholly in different spectral ranges of the light. However, the distribution of the absorption maxima of the light within the component is dependent on the wavelength. This has the effect that in this case the optimization of the thin-film optics for each individual absorber in each of the two tandem cells is very complicated and can only be effected to a limited extent by variation of the thicknesses of the layers (since the different conditions for the individual absorbers generally cannot be fulfilled simultaneously with a set of layer thicknesses).

A further problem for application consists in the fact that solar cells are intended to be used at different locations and under different conditions and the spectrum of the light is therefore different for different applications. Thus, e.g. the light spectrum for applications on roofs corresponds very well to the standard solar spectrum AM1.5 (for central Europe). For house façades integrated systems in towns and cities (especially within narrow urban canyons), however, the conditions are already different and at the latest in indoor applications the available light is completely dependent on the artificial light source. The problem therewith is that the entire optimization of the tandem cells can only ever be effected for a specific light spectrum. For the applications it is thus important to have a simple possibility—which is practical for production—of adapting the tandem cells to different light spectra, without this necessitating greatly changing the construction of the tandem cell or using different absorber materials for each application.

Besides optimizing the luminous efficiency, a further problem consists in the fact that the organic solar cells used are intended to be applied on flexible substrates, such as films, for instance.

The problem here is that although there are very good encapsulation possibilities (e.g. glass-glass encapsulation), for many applications the latter are too expensive and often not flexible. An inexpensive encapsulation that is as flexible as possible is not perfect, i.e. it does not hermetically seal the component completely, rather e.g. water and oxygen gradually penetrate into the cell. A resultant requirement made of the cell is that the latter as far as possible is already itself intended to be very stable toward air and other atmospheres. The aim is therefore to increase the lifetime and to realize an improved stability by virtue of a corresponding encapsulation. At the same time, the intention is to specify a cost-effective possibility for lengthening the lifetime of organic solar cells.

It is known from the literature that metal oxide layers are used as contact layers (Cattin et al., JOURNAL OF APPLIED PHYSICS 105, 034507 (2009); Kim et al., APPLIED PHYSICS LETTERS 95, 093304 (2009). However, increased stability of the components is not mentioned here.

US 2007/0221926 A1, by contrast, discloses a $TiO_x$ layer which was applied as a passivation layer to the organic material of a photoactive, organic component and leads to an increased lifetime of the solar cell.

SUMMARY OF THE INVENTION

Consequently, the invention is based on the object of specifying a photoactive component that overcomes the disadvantages described above and in this case has an increased efficiency of the component and as far as possible an improved lifetime.

The above discussion equally holds true, of course, for triple solar cells and solar cells composed of more than three subcells.

According to the invention, the object of optimizing the single, tandem or multiple solar cells is achieved by virtue of the fact that a passivation layer composed of a metal oxide layer is situated between the photoactive layer system and the top counterelectrode. Especially in the case of air-sensitive electrode materials (e.g. Al), the metal oxide layer serves here for stabilizing the top electrode material. Moreover, the passivation layer can prevent the ingress of oxygen and moisture into the photoactive component. In particular, ingress into the organic layers is prevented. A lengthening of the lifetime of the photoactive component is realized as a result.

In one embodiment of the invention, at least one cavity layer system is inserted within at least one cell or between at least two adjacent cells, and alters the optical cavity of the component. The designation cell is used here synonymously for a single cell or a subcell of a tandem or multiple cell.

In this case, the cavity layer system or the cavity layer systems has/have the effect of intensifying a subcell with regard to its absorption (in particular the subcell which is limited in terms of its (practically) useable layer thickness on account of inadequate charge carrier transport properties within the photoactive system) and/or make(s) possible a simple adaptation of single, tandem or multiple cells to the respective illumination spectrum of the application.

This is preferably achieved by means of a layer system which functions as a partly transparent mirror. In this case, the transparency of said mirror can be wavelength-dependent. As a result, the light distribution within the component can be optimized in a wavelength-dependent manner and it is possible to achieve the effect that the different absorbers in the subcells are situated in the highest possible field distribution of the wavelength range absorbed by them.

The passivation layer between the photoactive layer system and the top counterelectrodes serves for stabilizing the top electrode material, especially in the case of air-sensitive electrode materials (e.g. Al).

The top counterelectrode consists of a metal (e.g. but not restricted to Ag, Au, Ti, Ni, Cr, Cu, Fe or combinations thereof), a transparent conductive oxide (e.g. but not restricted to ITO, ZnO, ZnO:Al), of a doped organic layer (e.g. small molecules, n-doped C60 or a highly conductive recombination system of a pn-layer system), of organic crystals, a conductive polymer (e.g. but not restricted to PEDOT:PSS), of an air-sensitive electrode material (e.g. but not restricted to Al) or of combinations of the aforementioned materials, wherein here the metal oxide layer serves for stabilizing the top electrode material.

In one embodiment of the invention, the passivation layer consists of a metal oxide selected from a group consisting of titanium oxide ($TiO_2$, $TiO_x$, where x has a value of between 1 and 1.96), zinc oxide, tin oxide, copper oxide, tungsten oxide, chromium oxide, silver oxide, nickel oxide, gold oxide, molybdenum oxide, or a combination of these materials.

In this case, the metal oxide is applied by means of suitable methods such as vapor deposition, sputtering, etc.

In one embodiment of the invention, the passivation layer is wholly or partly doped.

In one embodiment of the invention, the top counterelectrode or a part of the top counterelectrode has a strip, grid or busbar structure.

In one embodiment of the invention, the passivation layer directly adjoins a doped, partly doped or undoped transport layer.

In one embodiment of the invention, the organic layers consist at least partly of small molecules, at least partly of polymers or of a combination of small molecules and polymers.

In a further embodiment, a cavity layer system is a metal layer system which is utilized for changing the optical field distribution within the organic solar cell in a targeted manner.

In a further embodiment, a cavity layer system is partly transparent by virtue of the fact that it is present only on a part of the solar cell area.

In a further embodiment, a cavity layer system is transparent to light of one specific type of polarization, while said cavity layer system reflects light of another type of polarization.

In a further embodiment, at least one cavity layer system is separated from the photoactive layer systems by at least one transport layer.

In a further embodiment, a cavity layer system is in direct contact with the photoactive layer system or is even wholly or partly situated within the photoactive layer system.

In a further embodiment of the component, such cavity layer systems can also be present between a plurality or else all of the subcells.

In a further embodiment of the component, the cavity layer systems can all be identical.

In a further embodiment of the component, the cavity layer systems can differ only in the thicknesses of the materials used.

In a further embodiment of the component, two or more of the cavity layer systems can at least partly consist of different materials.

In a further embodiment of the component, all of the cavity layer systems in a pairwise manner can at least partly consist of different materials.

In a further preferred embodiment of the component, the cavity layer system consist of a metal layer, for example but not restricted to Au, Ag, Al, Cr, Ni, Co, Cu, Ti, etc.

In a further embodiment of the component, the cavity layer systems consist of two or more different metal layers. This can be a pairwise or else non-pairwise different combination.

In a further embodiment of the component, the cavity layer systems form a grating. The dimension of the grating structuring can preferably be in the mm range, in the μm range or else in the wavelength range of the light.

In a further embodiment of the component, the cavity layer systems form a metal grating, for example but not restricted to Au, Ag, Al, Cr, Ni, Co, Cu, Ti, etc.).

In a further embodiment of the component, the cavity layer systems consist of rods or strips. The thickness of the rods/strips or the distances between the rods/strips can preferably be in the mm range, in the μm range or else in the wavelength range of the light. In the latter case, the cavity layer system forms a linear polarization filter.

In a further embodiment of the component, the cavity layer systems consist of metal rods or metal strips, for example but not restricted to Au, Ag, Al, Cr, Ni, Co, Cu, etc. In this case, the thicknesses and distances of the rods or strips can be chosen such that the cavity layer systems form a polarization filter.

In a further embodiment of the component, the cavity layer systems consist of circles, triangles, polygons, diamond-shaped areas or other geometrical areas.

In a further embodiment of the component, the cavity layer systems consist of metal layers which form circles, triangles, polygons, diamond-shaped areas or other geometrical metal areas, for example but not restricted to Au, Ag, Al, Cr, Ni, Co, Cu, etc.

In a further embodiment of the component, the cavity layer systems consist of metal layers which form "banana structures". In the banana structures, both pointed ends are oriented toward the active layer system. The field boosting therefore preferably takes place into the active layer system, which is particularly advantageous.

In a further embodiment of the component, the cavity layer systems consist of metal structures, wherein the surfaces of the metal structures are coated with an organic or inorganic insulator material, which is preferably transparent.

In a further embodiment of the component, the cavity layer systems consist of a doped, partly doped or undoped metal oxide layer system.

In a further embodiment of the component, the cavity layer systems consist of one, two or more different doped, partly doped or undoped metal oxide layers (this can be a pairwise or else non-pairwise different combination).

In a further embodiment of the component, the cavity layer systems consist of a doped, partly doped or undoped organic layer. The organic material can be polymers, small molecules or combinations of both.

Within the meaning of the present invention, small molecules are understood to be non-polymeric organic molecules having monodisperse molar masses of between 100 and 2000 which are present in a solid phase under normal pressure (air pressure of the atmosphere surrounding us) and at room temperature. In particular, said small molecules can also be photoactive, wherein photoactive is understood to mean that the molecules change their charge state under light incidence.

In a further embodiment of the invention, the organic materials used are at least partly polymers.

In a further embodiment of the component, the cavity layer systems consist of two or more different doped, partly doped or undoped organic layers (this can be a pairwise or else non-pairwise different combination). In this case, the organic layer system can consist of multilayers, mixed layers or combinations of both.

In a further embodiment of the component, the cavity layer systems consist of a doped, partly doped or undoped layer composed of graphite, carbon nanotubes or graphenes.

In a further embodiment of the component, the cavity layer systems consist of two or more different doped, partly doped or undoped layers composed of graphite, carbon nanotubes or graphenes (this can be a pairwise or else non-pairwise different combination).

In a further embodiment of the component, the cavity layer systems consist of a combination of two or more of the abovementioned materials.

In a further embodiment of the component, the cavity layer systems consist of a material or a material system having a high dielectric constant.

In a further embodiment of the component, the cavity layer systems consist of a material or a material system which is a metamaterial.

A metamaterial is an artificially produced structure whose permittivity $\varepsilon r$ and permeability $\mu r$ with respect to electric and magnetic fields have values that do not usually occur in nature. Metamaterials having real refractive indices in the range of $-\infty < n < 1$ are of particular interest. These materials do not absorb light and are therefore particularly suitable for the use according to the invention as a cavity layer system.

Metamaterials are characterized in that they have within them specially produced microscopic structures composed of electrical or magnetically active materials which are responsible for the particular properties of the material.

The particular property of metamaterials is that the associated material constants $\varepsilon r$ and $\mu r$ can assume negative values. From the standpoint of field theory this means that the field of the electric flux density (D field) and that of the electric field strength (E field) and the field of the magnetic flux density (B field) and the field of the magnetic field strength (H field) are directed oppositely to one another.

The underlying processes in metamaterials are usually resonance effects into periodic arrangements of conductor elements. In a simplified consideration, the material consists of a large number of juxtaposed electrical resonant circuits having tiny capacitive and inductive components. The capacitances arise as a result of metallic conductor elements situated opposite one another, while the inductive elements are the conductor elements themselves. By way of example, what are involved are nanostructures, usually composed of gold or silver, which are embedded in glass and are much smaller than the wavelength of the light.

As is usual in the case of resonance phenomena, the desired effects in the case of the metamaterials are manifested only in a very narrow frequency range. Although the frequency range of a resonant structure can be increased by damping, in principle, the damping simultaneously leads to an undesired increase in the power loss.

In a further embodiment of the component, the cavity layer systems can also be composed of a combination of the abovementioned materials or structures (gratings, rods, strips, geometrical forms).

A further embodiment of the component additionally contains one or two transparent or partly transparent electrodes besides at least one cavity layer system.

A further embodiment of the component contains at least one cavity layer system and the component is semitransparent.

In a further embodiment of the component the cavity layer systems can be incorporated into a pin-single cell, pin-tandem cell or pin-multiple cell (or nip-single cell, nip-tandem cell or nip-multiple cell). In this case, the cavity layer systems can be e.g. semitransparent and/or wavelength-dependent and/or polarization-sensitive.

In a further embodiment of the component, the cavity layer systems consist of chiral materials. Chiral materials are materials which change the polarization plane of the light. Generally, an object is chiral if it has no rotation-reflection axis.

Figure 1:
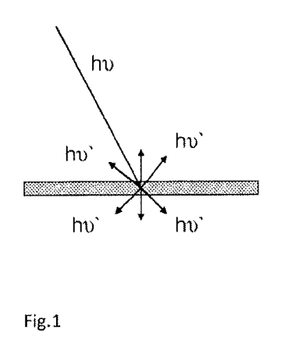
FIG. 1 shows a schematic illustration of the altered intensity distribution of the solar spectrum within the component, and the light vector, wherein the fluorescence and phosphorescence go in all spatial directions.

In a further embodiment of the component, the cavity layer systems consist of fluorescent or phosphorescent materials. The cavity layer system fluoresces in the greater wavelength range in comparison with its absorption (Stokes shift), i.e. the intensity distribution of the solar spectrum within the component can be altered, and also the light vector, since the fluorescence and phosphorescence go in all spatial directions (FIG. 1).

Examples of organic fluorescent or phosphorescent materials are as follows:

1.) Blue Emitters:
Balq bis(2-methyl-8-quinolinolato)-4-(phenylphenolato)-aluminum-(III)
DPVBi 4,4-bis(2,2-diphenylethen-1-yl)biphenyl
spiro-DPVBi 2,2',7,7'-tetrakis(2,2-diphenylvinyl)spiro-9,9'-bifluorene
spiro-anthracene 9,10-bis(9,9'-spirobi[9H-fluorene]-2-yl)-anthracene
DBzA 9,10-bis[4-(6-methylbenzothiazol-2-yl)phenyl]-anthracene
DSA-Ph 1-4-di-[4-(N,N-diphenyl)amino]styrylbenzene
BCzVB 1,4-bis[2-(3-N-ethylcarbazoryl)vinyl]benzene 2.) Green Emitters:
Alq3 tris(8-hydroxyquinolinato)aluminum
C545T 2,3,6,7-tetrahydro-1,1,7,7,-tetramethyl-1H,5H,11H-10-(2-benzothiazolyl)quinolizino-[9,9a,1gh]coumarin
TPPA 9,10-bis[N,N-di-(p-tolyl)amino]anthracene
DMQA N,N'-dimethylquinacridone
Ir(ppy)$_3$ fac tris(2-phenylpyridine)iridium (as dopant in TCTA 4,4',4"-tris(N-carbazolyl)-triphenylamine)

3.) Red Emitters:
rubrene (5,6,11,12)-tetraphenylnaphtacene
DCM (E)-2-(2-(4-(dimethylamino)styryl)-6-methyl-4H-pyran-4-ylidene)malononitrile
DCM2 4-(dicyanomethylene)-2-methyl-6-julolidyl-9-enyl-4H-pyran
DCJT 4-(dicyanomethylene)-2-methyl-6-(1,1,7,7-tetramethyljulolidyl-9-enyl)-4H-pyran
DCJTB 4-(dicyanomethylene)-2-tert-butyl-6-(1,1,7,7-tetra-methyljulolidin-4-ylvinyl)-4H-pyran
Ir(piq)3 tris(1-phenylisoquinoline)iridium
Ir(MDQ)2(acac) iridium(III)bis(2-methyldibenzo-[f,h]-quinoxaline) (acetyl acetonate)
(both as dopant in alpha-NPB)

In one advantageous embodiment of the invention, the photoactive layers of the component absorb as much light as possible. For this purpose, the spectral range in which the component absorbs light is made as wide as possible.

The problem of organic solar cells usually consists in the fact that for electrical reasons (good transport for the charge carriers only to a limited extent) the i-layer(s) can only be made very thin. This has the consequence that only part of the light is absorbed in the component. Furthermore, the absorption bands of organic materials have a limited width and, for most efficient materials used in solar cells, typically have a spectral width of approximately 200 nm. This has the consequence that the two materials which form the photoactive junction (double layer or mixed layer) can only cover a spectral range of approximately 400 nm. However, a solar cell having a very high efficiency must have a very high absorption as far as possible over the complete spectral range from approximately 350 nm to approximately 1000 nm.

In one advantageous configuration of the above embodiment of the invention, the i-layer system of the photoactive component consists at least of two mixed layers directly adjoining one another and at least one of the two main materials of one mixed layer is a different organic material than the two main materials of another mixed layer. Each mixed layer consists of at least two main materials, wherein the latter form a photoactive donor-acceptor system. The donor-acceptor system is distinguished by the fact that at least for the photo-excitation of the donor component it holds true that the excitons formed at the interface with the acceptor are preferably separated into a hole on the donor and an electron on the acceptor. The term main material denotes a material whose proportion by volume or mass in the layer is greater than 16%. Further materials can be admixed in a technically governed manner or else for setting layer properties. Even in the case of a double mixed layer, the component contains three or four different absorber materials and can thus cover a spectral range of approximately 600 nm or approximately 800 nm, respectively, and thus fulfill the stated object.

In a further embodiment of the invention, the double mixed layer can also be used for obtaining significantly higher photocurrents for a specific spectral range, by mixing materials which preferably absorb in the same spectral range. This can then furthermore be used to achieve current matching between the different subcells in a tandem solar cell or multiple solar cell. Besides the use of the cavity layer, this affords a further possibility of matching the currents of the subcells.

In a further embodiment of the invention, in order to improve the charge carrier transport properties of the mixed layers, the mixing ratios in the different mixed layers can be identical or else different.

In a further embodiment of the invention, the mixed layers preferably consist of two main materials in each case.

In a further embodiment of the invention, a gradient of the mixing ratio can be present in the individual mixed layers.

In one preferred configuration of the invention, the photoactive component is embodied as tandem cells and, through the use of double or multiple mixed layers, there is the further advantage that the current matching between the subcells can be optimized by the choice of the absorber materials in the mixed layers and the efficiency can thus be increased further.

In a further embodiment of the invention, the individual materials can in this case be positioned in different maxima of the light distribution of the characteristic wavelengths absorbed by said material. Thus, by way of example, one material in a mixed layer can lie in the $2^{nd}$ maximum of its characteristic wavelength, and the other material in the $3^{rd}$ maximum.

In a further embodiment of the invention, the photoactive component, more particularly an organic solar cell, consists of an electrode and a counterelectrode and at least two organic photoactive mixed layers between the electrodes, wherein the mixed layers in each case substantially consist of two materials and the two main materials of a respective mixed layer form a donor-acceptor system and the two mixed layers directly adjoin one another and at least one of the two main materials of one mixed layer is a different organic material than the two main materials of another mixed layer.

In one development of the embodiment described above, a plurality or all of the main materials of the mixed layers are different from one another.

In a further embodiment of the invention, three or more mixed layers are involved, which are arranged between the electrode and counterelectrode.

In a further embodiment of the invention, in addition to the mixed layers mentioned, even further photoactive single or mixed layers are present.

In a further embodiment of the invention, at least one further organic layer is additionally present between the mixed layer system and one electrode.

In a further embodiment of the invention, at least one further organic layer is additionally present between the mixed layer system and the counterelectrode.

In a further embodiment of the invention, one or more of the further organic layers are doped wide-gap layers, wherein the maximum of the absorption is at <450 nm.

In a further embodiment of the invention, at least two main materials of the mixed layers have different optical absorption spectra.

In a further embodiment of the invention, the main materials of the mixed layers have different optical absorption spectra, which mutually complement one another, in order to cover a spectral range that is as wide as possible.

In a further embodiment of the invention the absorption range of at least one of the main materials of the mixed layers extends into the infrared range.

In a further embodiment of the invention, the absorption range of at least one of the main materials of the mixed layers extends into the infrared range in the wavelength range of >700 nm to 1500 nm.

In a further embodiment of the invention, the HOMO- and LUMO-levels of the main materials are adapted such that the system enables a maximum open-circuit voltage, a maximum short-circuit current and a maximum filling factor.

In a further embodiment of the invention, the organic materials used for the mixed layers are small molecules.

In a further embodiment of the invention, the organic materials used for the mixed layers are at least partly polymers.

In a further embodiment of the invention, at least one of the photoactive mixed layers contains as acceptor a material from the group of fullerenes or fullerene derivatives (C60, C70, etc.).

In a further embodiment of the invention, all photoactive mixed layers contain as acceptor a material from the group of fullerenes or fullerene derivatives (C60, C70, etc.).

In a further embodiment of the invention, at least one of the photoactive mixed layers contains as donor a material from the class of phthalocyanines, perylene derivatives, TPD derivatives, oligothiophenes or a material as described in WO2006092134.

In a further embodiment of the invention, at least one of the photoactive mixed layers contains as acceptor the material fullerene C60 and as donor the material 4P-TPD.

In a further embodiment of the invention, the contacts consist of metal, a conductive oxide, in particular ITO, ZnO:Al, or other TCOs, or a conductive polymer, in particular PEDOT:PSS or PANI.

Polymer solar cells comprising two or more photoactive mixed layers, wherein the mixed layers directly adjoin one another, are also possible within the meaning of the invention. In the case of polymer solar cells there is the problem that the materials are applied from solution and, consequently, a further applied layer very easily has the effect that the underlying layers are dissolved partially, dissolved or altered in terms of their morphology. In the case of polymer solar cells, therefore, multiple mixed layers can be produced only to a very limited extent, and also only by using different material and solvent systems which do not or hardly influence one another during production. Solar cells composed of small molecules have a very clear advantage here, since, by virtue of the vapor deposition process in a vacuum, any desired systems and layers can be applied to one another and, consequently, the advantage of the multiple mixed layer structure can be utilized very widely and realized with any desired material combinations. Furthermore, the incorporation of the multiple mixed layers in pin-structures (or nip) with controlled n- and p-type doping is very advantageous. Within the meaning of the present invention, small molecules are understood to be non-polymeric organic, photoactive molecules.

Transport problems for the charge carriers occur to an increased extent in multiple mixed layer systems. This transporting-away is significantly facilitated by the incorporated field of the pin-structure. Furthermore, it is possible to displace the multiple mixed layers within a pin-structure with doped wide-gap transport layers in order to obtain an optimum absorption. For this purpose, it can also be very advantageous to alter the pin-structure into a nip-structure. Especially if the different materials in the multiple mixed layers absorb in different wavelength ranges, it is possible, through a suitable choice of the structure (pin or nip), or a suitable choice of the layer thicknesses of the transport layers, to position the different materials in each case at the optimum position with regard to the intensity distribution of the light within the component. Especially in the case of tandem cells, this optimization is very important in order to achieve a balancing of the photocurrents of the single cells and thus to achieve a maximum efficiency.

In the case of non-polymeric organic materials, so-called small molecules, the evaporation temperature in a vacuum is closely related to the intermolecular interactions. If said interactions are highly pronounced, this leads to an increased evaporation temperature.

Within the meaning of the invention, the term evaporation temperature is understood to mean that temperature which is required in order to achieve a vapor deposition rate of 0.1 nm/s at the position of the substrate for a given evaporator geometry (reference: source having a circular opening (diameter of 1 cm) at a distance of 30 cm from a substrate fitted perpendicularly thereabove) and a vacuum in the range of $10^{-4}$ to $10^{-10}$ mbar. In this case, it is unimportant whether evaporation in the narrower sense (transition from the liquid phase to the gas phase), or sublimation is involved in this case.

In the course of layer formation by vapor deposition, therefore, those structures in which the intermolecular interactions within the layer are maximized preferably arise, such that the interfaces which can enter into great interactions are avoided at the layer surface.

In the case of mixed layers, that has the effect that that component which has comparatively weak interaction forces preferably attaches to the surface, that is to say that this component "floats" to a certain extent during layer formation. Materials having comparatively weak interaction between the molecules are normally distinguished by a low melting point (e.g. <100° C.) or a low glass transition temperature (e.g. <150° C.)

If the "more weakly interacting component" is the donor component of the mixed layer, there is a tendency for—in particular during growth on a heated substrate or during subsequent heat treatment—a very thin layer (i.e. at least one monolayer) to arise at the surface, which consists almost exclusively of the donor material. This segregation or this "floating" can also arise or be supported through other processes such as e.g. a solvent treatment (during the production of the layer or subsequently) or through the method of depositing a layer by means of organic vapor-phase deposition (OVPD). The monolayer of the donor component which "floated" consequently has poorer electron transport properties and impedes the process of transporting away photogenerated electrons in the case of a pin structure. By contrast, it is possible for photogenerated holes to be transported away in this direction without any problems, since, after all, the donor component is a preferably hole-transporting material.

The above-described problem occurs preferably when the donor material has an evaporation temperature in a vacuum which is at least 150° C. lower than the evaporation temperature of the acceptor material. However, it is also entirely possible for "floating" to take place even in the case of an evaporation difference of 100° C. or less.

Organic solar cells described in the literature which are made from vacuum deposition of non-polymeric organic molecules, so-called small molecules, are constructed, apart from a few exceptions (Drechsel, Org. Electron., 5, 175 (2004); J. Drechsel, Synthet. Metal., 127, 201-205 (2002)), such that the so-called bottom contact, on which the organic layers are deposited, forms the anode (if the structure comprises an exclusively hole-conducting or p-doped layer, the latter adjoins the bottom contact). The anode is generally a transparent conductive oxide (often indium tin oxide, abbreviated to ITO; however, it can also be ZnO:Al), but it can also be a metal layer or a layer composed of a conductive polymer. After the deposition of the organic layer system comprising the photoactive mixed layer, a—usually metallic—cathode is deposited.

This construction has the consequence that the holes formed in the photoactive mixed layer have to be carried away toward the substrate (anode), while the photogenerated electrons have to move away from the substrate in the direction of the cathode. This is problematic, however, as described above, if the "floating" of the donor component occurs during the deposition or aftertreatment of the mixed layer.

This problem is manifested to a greater extent, the nearer to thermal equilibrium the growth of the mixed layer takes place. The advantage of an improved order in the volume during growth nearer to equilibrium (nanocrystalline instead of amorphous structure, cf. M. Hiramoto et al., Mol. Cryst. Liq. Cryst., 2006, 444, pp. 33-40; M. Rusu et al., Thin Solid Film, 2008, 516, pp. 7160-7166) is therefore counteracted by an increasing problem at the interface.

In a further embodiment, in the case of a donor-acceptor combination wherein at least partial "floating" of the donor material in the mixed layer takes place, use is made of an inverted layer sequence wherein the deposition takes place on the cathode (n-side at the bottom, e.g. n-i-p structure) and the photogenerated electrons thus have to leave the mixed layer in the direction toward the substrate, and the photogenerated electrons in the direction of the counterelectrode, both being possible without any problems. This has the consequence of firstly obtaining a good order in the mixed layer and at the same time incurring no transport problems at the interface of the mixed layer.

For the above-described inverted structure (n-i-p, i-p or n-i structure) it may be that contact problems occur in the component at the electrode situated on the substrate and/or the counterelectrode:

normally, in the traditional p-i-n structure, the electrode situated on the substrate has a contact to the p-layer and the counterelectrode has a contact to the n-layer. These contacts function very well, or that is to say the contact systems and contact materials have been optimized in the meantime, with the result that no losses occur here. As a possible solution for the inverted structure, the two new contact systems electrode/n-layer and p-layer/counterelectrode can now be optimized anew (e.g. through a suitable choice of the materials or suitable production conditions). Another solution possibility consists in incorporating a conversion contact (pn or np) at the electrodes, such that the old contact systems of electrode/p-layer and n-layer/counterelectrode are again obtained. Possible structures for this purpose include e.g. pnip, nipn or pnipn.

A further embodiment of the component according to the invention consists in the fact that a p-doped layer is also present between the first electron-conducting layer (n-layer) and the electrode situated on the substrate, with the result that a pnip or pni structure is involved, wherein the doping is preferably chosen to be high enough that the direct pn contact has no blocking effect, rather low-loss recombination occurs, preferably by means of a tunneling process.

In a further embodiment of the invention, a p-doped layer can also be present in the component between the photoactive i-layer and the electrode situated on the substrate, with the result that a pip or pi structure is involved, wherein the additional p-doped layer has a Fermi level situated at most 0.4 eV, but preferably less than 0.3 eV, below the electron transport level of the i-layer, with the result that low-loss electron extraction from the i-layer into this p-layer can occur.

A further embodiment of the component according to the invention consists in the fact that an n-layer system is also present between the p-doped layer and the counterelectrode, with the result that an nipn or ipn structure is involved, wherein the doping is preferably chosen to be high enough that the direct pn contact has no blocking effect, rather low-loss recombination occurs, preferably by means of a tunneling process.

In a further embodiment, an n-layer system can also be present in the component between the intrinsic, photoactive layer and the counterelectrode, with the result that an nin or in structure is involved, wherein the additional n-doped layer has a Fermi level situated at most 0.4 eV, but preferably less than 0.3 eV, above the hole transport level of the i-layer, with the result that low-loss hole extraction from the i-layer into this n-layer can occur.

A further embodiment of the component according to the invention consists in the fact that the component contains an n-layer system and/or a p-layer system, with the result that a pnipn, pnin, pipn or p-i-n structure is involved, which in all cases are distinguished by the fact that—independently of the conduction type—the layer adjoining the photoactive i-layer on the substrate side has a lower thermal work function than the layer adjoining the i-layer and facing away from the substrate, with the result that photogenerated electrons are preferably transported away toward the substrate if no external voltage is applied to the component.

In a further embodiment of the invention, a plurality of conversion contacts are connected in series with the result that e.g. an npnipn, pnipnp, npnipnp, pnpnipnpn or pnpnpnipnpnpn structure is involved.

In one preferred development of the structures described above, the latter are embodied as an organic tandem solar cell or multiple solar cell. Thus, the component can be a tandem cell composed of a combination of nip, ni, ip, pnip, pni, pip, nipn, nin, ipn, pnipn, pnin or pipn structures, wherein a plurality of independent combinations containing at least one i-layer are stacked one above another (cross-combinations).

In one particularly preferred embodiment of the structures described above, the latter is embodied as a pnipnipn tandem cell.

What is particularly important in stacked cells of this type is the balance of the generated currents in the individual cells, that is to say the number of absorbed photons converted into charge carriers. If the "floating" problem described above occurs e.g. in the case of a pinpin tandem cell having two different absorber systems in the case of a mixed layer, and if said mixed layer therefore generates less current or has a poorer filling factor and the tandem solar cell is thereby greatly diminished in its properties (the weaker subcell, with its lower generated current or poorer filling factor (FF), limits the entire component, that is to say that the other subcell, too, can no longer fulfill its potential), then the problem is solved according to the invention by changing to an inverted nipnip structure or to another of the structures described above.

In a further embodiment, the acceptor material in the mixed layer is present at least partly in crystalline form.

In a further embodiment, the donor material in the mixed layer is present at least partly in crystalline form.

In a further embodiment, both the acceptor material and the donor material in the mixed layer are present at least partly in crystalline form.

In a further embodiment, the acceptor material has an absorption maximum in the wavelength range of >450 nm.

In a further embodiment, the donor material has an absorption maximum in the wavelength range of >450 nm.

In a further embodiment, the photoactive i-layer system also contains further photoactive individual or mixed layers in addition to the mixed layer mentioned.

In a further embodiment, the n-material system consists of one or more layers.

In a further embodiment, the p-material system consists of one or more layers.

In a further embodiment, the n-material system contains one or more doped wide-gap layers. In this case, the term wide-gap layers defines layers having an absorption maximum in the wavelength range of <450 nm.

In a further embodiment, the p-material system contains one or more doped wide-gap layers.

In a further embodiment, the component contains a p-doped layer between the first electron-conducting layer (n-layer) and the electrode situated on the substrate, with the result that a pnip or pni structure is involved.

In a further embodiment, the component contains a p-doped layer between the photoactive i-layer and the electrode situated on the substrate, with the result that a pip or pi structure is involved, wherein the additional p-doped layer has a Fermi level situated at most 0.4 eV, but preferably less than 0.3 eV, below the electron transport level of the i-layer.

In a further embodiment, the component contains an n-layer system between the p-doped layer and the counterelectrode, with the result that an nipn or ipn structure is involved.

In a further embodiment, the component contains an n-layer system between the photoactive i-layer and the counterelectrode, with the result that an nin or in structure is involved, wherein the additional n-doped layer has a Fermi level situated at most 0.4 eV, but preferably less than 0.3 eV, above the hole transport level of the i-layer.

In a further embodiment, the component contains an n-layer system and/or a p-layer system, with the result that a pnipn, pnin, pipn or p-i-n structure is involved.

In a further embodiment, the additional p-material system and/or the additional n-material system contains one or more doped wide-gap layers.

In a further embodiment, the component contains still further n-layer systems and/or p-layer systems, with the result that e.g. an npnipn, pnipnp, npnipnp, pnpnipnpn or pnpnpnipnpnpn structure is involved.

In a further embodiment, one or more of the further p-material systems and/or of the further n-material systems contain(s) one or more doped wide-gap layers.

In a further embodiment, the component is a tandem cell composed of a combination of nip, ni, ip, pnip, pni, pip, nipn, nin, ipn, pnipn, pnin or pipn structures.

In a further embodiment, the organic materials used are small molecules. Within the meaning of the invention, the term small molecules is understood to mean monomers which can be evaporated and thus deposited on the substrate.

In a further embodiment, the organic materials are at least in part polymers, but at least one photoactive i-layer is formed from small molecules.

In a further embodiment, the acceptor material is a material from the group of fullerenes or fullerene derivatives (preferably C60 or C70) or a PTCDI derivative (perylene-3,4,9,10-bis(dicarboximide) derivative).

In a further embodiment, the donor material is an oligomer, in particular an oligomer according to WO2006092134, a porphyrin derivative, a pentacene derivative or a perylene derivative, such as DIP (diindenoperylene), DBP (dibenzoperylene).

In a further embodiment, the p-material system contains a TPD derivative (triphenylaminedimer), a spiro compound, such as spiropyrans, spirooxazines, MeO-TPD (N,N,N',N'-tetrakis (4-methoxyphenyl)benzidine), di-NPB (N,N'-diphenyl-N,N'-bis(N,N'-di(1-naphthyl)-N,N'-diphenyl-(1,1'-biphenyl)-4,4'-diamines), MTDATA (4,4',4"-tris(N-3-methylphenyl-N-phenylamino)tri-phenylamine), TNATA (4,4',4"-tris[N-(1-naphthyl)-N-phenylamino]triphenylamine), BPAPF (9,9-bis{4-[di-(p-biphenyl)aminophenyl]}fluorenes), NPAPF (9,9-bis[4-(N,N'-bisnaphthalen-2-ylamino)phenyl]-9H-fluorenes), spiro-TAD (2,2',7,7'-tetrakis (diphenylamino)-9,9'-spirobifluorene), PV-TPD (N,N-di-4-2,2-diphenylethen-1-ylphenyl-N,N-di-4-methylphenylphenylbenzidines), 4P-TPD (4,4'-bis(N,N-diphenylamino)tetraphenyl), or a p-material described in DE102004014046.

In a further embodiment, the n-material system contains fullerenes such as, for example, C60, C70; NTCDA (1,4,5,8-naphthalenetetracarboxylic dianhydrides), NTCDI (naphthalenetetracarboxylic diimides) or PTCDI (perylene-3,4,9,10-bis(dicarboximide).

In a further embodiment, the p-material system contains a p-dopant, wherein said p-dopant is F4-TCNQ, a p-dopant as described in DE10338406, DE10347856, DE10357044, DE102004010954, DE102006053320, DE102006054524 and DE102008051737, or a transition metal oxide (VO, WO, MoO, etc.).

In a further embodiment, the n-material system contains an n-dopant, wherein said n-dopant is a TTF derivative (tetrathiafulvalene derivative) or DTT derivative (dithienothiophene), an n-dopant as described in DE10338406, DE10347856, DE10357044, DE102004010954, DE102006053320, DE102006054524 and DE102008051737, or Cs, Li or Mg.

In a further embodiment, one electrode is embodied in transparent fashion with a transmission >80% and the other electrode is embodied in reflective fashion with a reflection of >50%.

In a further embodiment, the component is embodied in semitransparent fashion with a transmission of 10-80%.

In a further embodiment, the electrodes consist of a metal (e.g. Al, Ag, Au or a combination thereof), a conductive oxide, in particular ITO, ZnO:Al or some other TCO (transparent conductive oxide), a conductive polymer, in particular PEDOT/PSS poly(3,4-ethylenedioxythiophene)-poly (styrenesulfonate) or PANI (polyaniline), or of a combination of these materials.

In a further embodiment, the organic materials used have a low melting point, preferably of <100° C.

In a further embodiment, the organic materials used have a low glass transition temperature, preferably of <150° C.

In a further embodiment of the invention, the optical path of the incident light in the active system is enlarged by the use of light traps.

In a further embodiment of the invention, the component is embodied as an organic pin-solar cell or organic pin-tandem solar cell. In this case, the term tandem solar cell denotes a solar cell which consists of a vertical stack of two solar cells connected in series.

In a further embodiment, the light trap is realized by virtue of the fact that the component is constructed on a periodically microstructured substrate and the homogeneous function of the component, that is to say a short-circuit-free contact-connection and homogeneous distribution of the electric field over the entire area, is ensured by the use of a doped wide-gap layer. Ultrathin components have, on structured substrates, an increased risk of forming local short circuits, with the result that the functionality of the entire component is ultimately jeopardized by such an evident inhomogeneity. This risk of short circuits is reduced by the use of the doped transport layers.

In a further embodiment of the invention, the light trap is realized by virtue of the fact that the component is constructed on a periodically microstructured substrate and the homogeneous function of the component, the short-circuit-free contact-connection thereof and a homogeneous distribution of the electric field over the entire area, is ensured by the use of a doped wide-gap layer. In this case, it is particularly advantageous that the light passes through the absorber layer at least twice which can lead to an increased light absorption and, as a result, to an improved efficiency of the solar cell. This can be achieved for example (FIG. 2) by virtue of the fact that the substrate has pyramidal structures on the surface having heights (h) and widths (d) in each case in the range of from one to several hundred micrometers. Height and width can be chosen to be identical or different. The pyramids can likewise be constructed symmetrically or asymmetrically.

In a further embodiment of the invention, the light trap is realized by virtue of the fact that a doped wide-gap layer has a smooth interface with respect to the i-layer and a rough interface with respect to the reflective contact. The rough interface can be achieved for example by means of a periodic microstructuring. The rough interface is particularly advantageous if it reflects the light diffusely, which leads to a lengthening of the light path within the photoactive layer.

In a further embodiment, the light trap is realized by virtue of the fact that the component is constructed on a periodically microstructured substrate and a doped wide-gap layer has a smooth interface with respect to the i-layer and a rough interface with respect to the reflective contact.

In a further embodiment of the invention, the entire structure is provided with a transparent bottom and top contact.

In a further embodiment, the photoactive components according to the invention are used on curved surfaces, such as, for example, concrete, roof tiles, clay, automobile glass, etc. In this case, it is advantageous that the organic solar cells according to the invention, by comparison with conventional inorganic solar cells, can be applied on flexible carriers such as films, textiles, etc.

In a further embodiment, the photoactive components according to the invention are applied to a film or textile which has, on the opposite side to the organic layer system according to the invention, an adhesion means such as, for example, an adhesive. It is thereby possible to produce a solar adhesive film which can be arranged as necessary on any desired surfaces. A self-adhesive solar cell can thus be produced.

In a further embodiment, the photoactive components according to the invention have a different adhesion means in the form of a hook-and-loop fastener.

In a further embodiment, the photoactive components according to the invention are used in conjunction with an energy buffer or energy storage medium such as, for example, rechargeable batteries, capacitors, etc. for connection to loads or devices.

In a further embodiment, the photoactive components according to the invention are used in combination with thin-film batteries.

In a further embodiment, the photoactive components according to the invention are used on curved surfaces, such as, for example, concrete, roof tiles, clay, automobile glass, etc. In this case, it is advantageous that the organic solar cells according to the invention, by comparison with conventional inorganic solar cells, can be applied on flexible carriers such as films, textiles, etc.

In a further embodiment, the photoactive components according to the invention are applied to a film or textile which has, on the opposite side to the organic layer system according to the invention, an adhesion means such as, for example, an adhesive. It is thereby possible to produce a solar adhesive film which can be arranged as necessary on any desired surfaces. A self-adhesive solar cell can thus be produced.

In a further embodiment, the organic solar cells according to the invention have a different adhesion means in the form of a hook-and-loop fastener.

BRIEF DESCRIPTION OF THE DRAWINGS

The invention will be explained thoroughly below on the basis of some exemplary embodiments and figures. In the figures.

DESCRIPTION OF PREFERRED EMBODIMENTS

Exemplary Embodiments

Figure 2:
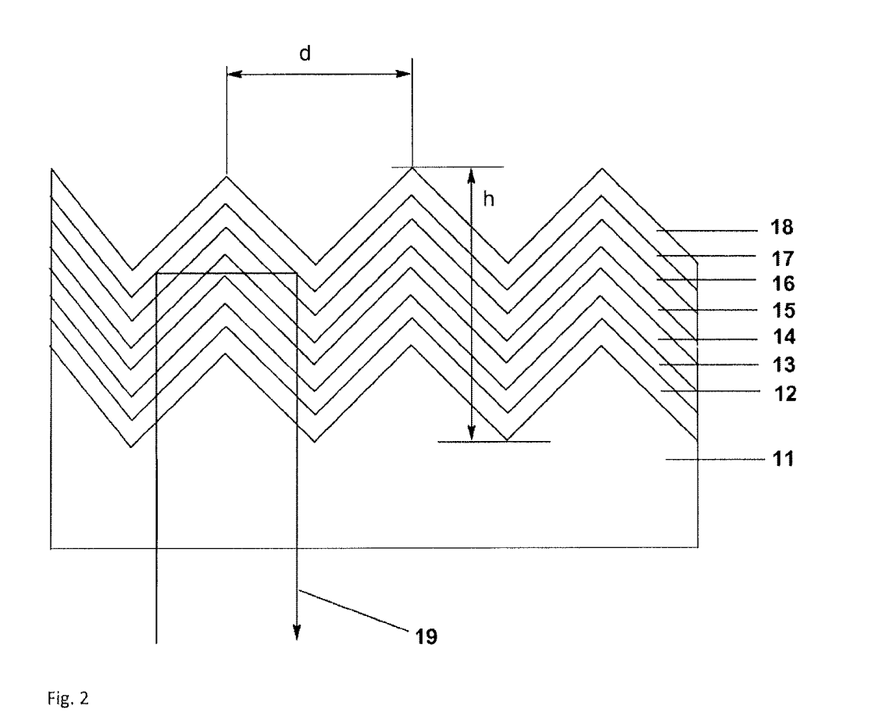
FIG. 2 shows the schematic illustration of a structure of an exemplary photoactive component on microstructured substrate.

In a first exemplary embodiment of the invention, in FIG. 2 use is made of a light trap for lengthening the optical path of the incident light in the active system.

In this case, the light trap is realized by virtue of the fact that the component is constructed on a periodically microstructured substrate and the homogeneous function of the component, the short-circuit-free contact-connection thereof and a homogeneous distribution of the electric field over the entire area, is ensured by the use of a doped wide-gap layer. In this case, it is particularly advantageous that the light passes through the absorber layer at least twice which can lead to an increased light absorption and, as a result, to an improved efficiency of the solar cell. This can be achieved for example as in FIG. 2 by virtue of the fact that the substrate has pyramidal structures on the surface having heights (h) and widths (d) in each case in the range of from one to several hundred micrometers. Height and width can be chosen to be identical or different. The pyramids can likewise be constructed symmetrically or asymmetrically. The width of the pyramidal structures is in this case between 1 μm and 200 μm. The height of the pyramidal structures can be between 1 μm and 1 mm.

Figure 3:
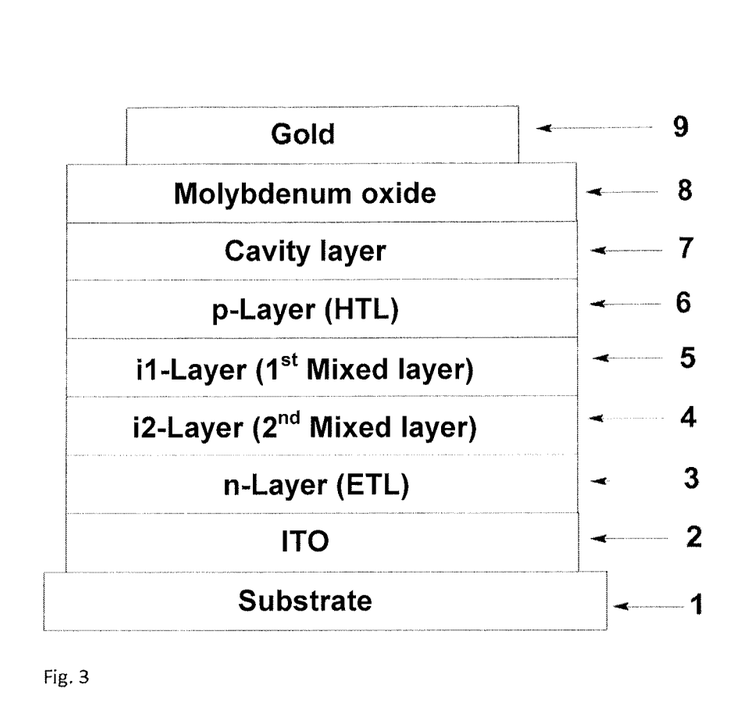
FIG. 3 shows a schematic illustration of the cross section of a component according to the invention comprising a cavity layer system.

Designation FIG. 2:
1 μm<d<200 μm
1 μm<h<1 mm
11: Substrate
12: Electrode; e.g. ITO or metal (10-200 nm)
13: HTL or ETL layer system (10-200 nm)
14: Absorber mixed layer 1 (10-200 nm)
15: Absorber mixed layer 2 (10-200 nm)
16: HTL or ETL layer system (10-200 nm)
17: Passivation layer (1 nm-200 nm)
18: Electrode; e.g. ITO or metal (10-200 nm)
19: Path of the incident light In a further exemplary embodiment, the photoactive component according to the invention has the following exemplary construction:
1. Electrode
2. Passivation layer
3. p-Transport layer system
4. Photoactive layer system 1
5. n-Transport layer system
6. Cavity layer system (e.g. semitransparent and/or wavelength-dependent and/or polarization-sensitive)
7. p-Transport layer system
8. Photoactive layer system 2
9. n-Transport layer system
10. Electrode In a further exemplary embodiment, the photoactive component according to the invention, as a pin-tandem cell or pin-multiple cell, wherein one or more transport layers are absent, has the following exemplary construction:
1. Electrode
2. Passivation layer
3. p-Transport layer system
4. Photoactive layer system 1
5. Cavity layer system (e.g. semitransparent and/or wavelength-dependent and/or polarization-sensitive)
6. p-Transport layer system
7. Photoactive layer system 2
8. n-Transport layer system
9. Electrode or:
1. Electrode
2. Passivation layer
3. p-Transport layer system
4. Photoactive layer system 1
5. n-Transport layer system
6. Cavity layer system (e.g. semitransparent and/or wavelength-dependent and/or polarization-sensitive)
7. Photoactive layer system 2
8. n-Transport layer system
9. Electrode or:
1. Electrode
2. p-Transport layer system
3. Photoactive layer system 1
4. Cavity layer system (e.g. semitransparent and/or wavelength-dependent and/or polarization-sensitive)
5. Photoactive layer system 2
6. n-Transport layer system
7. Passivation layer
8. Electrode In a further exemplary embodiment, the photoactive component according to the invention, as a pin-tandem cell or pin-multiple cell, wherein at least one cavity layer system is situated within one of the photoactive systems, has the following exemplary construction:
1. Electrode
2. Passivation layer
3. p-Transport layer system
4. Combination of photoactive layer system 1 and cavity layer system (e.g. semitransparent and/or wavelength-dependent and/or polarization-sensitive)
5. n-Transport layer system (can also be omitted, if appropriate)
6. p-Transport layer system (can also be omitted, if appropriate)
7. Photoactive layer system 2
8. n-Transport layer system 9. Electrode or:
1. Electrode
2. Passivation layer
3. p-Transport layer system
4. Photoactive layer system 1
5. n-Transport layer system (can also be omitted, if appropriate)
6. p-Transport layer system (can also be omitted, if appropriate)
7. Combination of photoactive layer system 2 and cavity layer system (e.g. semitransparent and/or wavelength-dependent and/or polarization-sensitive)
8. n-Transport layer system
9. Electrode In a further exemplary embodiment, the photoactive component according to the invention, as a pin-tandem cell or pin-multiple cell, wherein at least one cavity layer system is situated at one of the electrodes, has the following exemplary construction:
1. Electrode
2. Passivation layer
3. Cavity layer system (e.g. semitransparent and/or wavelength-dependent and/or polarization-sensitive)
4. p-Transport layer system (can also be omitted, if appropriate)
5. Photoactive layer system 1
6. n-Transport layer system
7. p-Transport layer system
8. Photoactive layer system 2
9. n-Transport layer system
10. Electrode or:
1. Electrode
2. Cavity layer system (e.g. semitransparent and/or wavelength-dependent and/or polarization-sensitive)
3. Passivation layer
4. p-Transport layer system (can also be omitted, if appropriate)
5. Photoactive layer system 1
6. n-Transport layer system
7. p-Transport layer system
8. Photoactive layer system 2
9. n-Transport layer system
10. Electrode or:
1. Electrode
2. Passivation layer
3. p-Transport layer system
4. Photoactive layer system 1
5. n-Transport layer system
6. p-Transport layer system
7. Photoactive layer system 2
8. n-Transport layer system (can also be omitted, if appropriate)
9. Cavity layer system (e.g. semitransparent and/or wavelength-dependent and/or polarization-sensitive)
10. Electrode In a further exemplary embodiment, the photoactive component according to the invention has the following layer order:
1. Electrode
2. Passivation layer
3. Cavity layer system (e.g. semitransparent and/or wavelength-dependent and/or polarization-sensitive)
4. p-Transport layer system
5. Photoactive layer system 1
6. n-Transport layer system
7. p-Transport layer system
8. Photoactive layer system 2
9. n-Transport layer system (can also be omitted, if appropriate)
10. Electrode In a further exemplary embodiment, the photoactive component according to the invention in FIG. 3 has the following layer order:
Glass substrate 1,
ITO bottom contact 2,
Electron transport layer (ETL) 3,
Active i-Double-layer system 4P-TPD:C60/DCV6T:C60 4, 5,
p-doped hole transport layer (HTL) 6,
cavity layer system (e.g. semitransparent and/or wavelength-dependent and/or polarization-sensitive) 7,
Passivation layer (molybdenum oxide) 8,
Top contact (e.g. Gold) 9.

Figure 4:
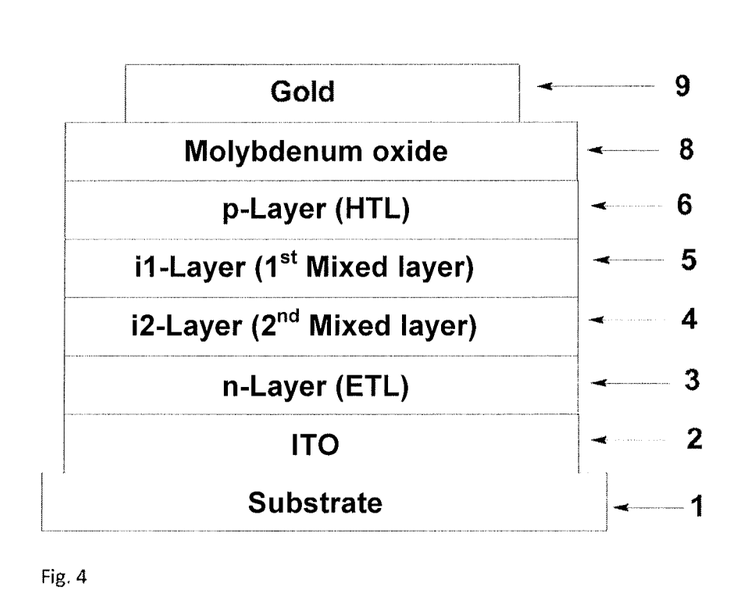
FIG. 4 shows a schematic illustration of the cross section of a component according to the invention.

In a further exemplary embodiment, the photoactive component according to the invention in FIG. 4 has the following layer order:
Glass substrate 1,
ITO bottom contact 2,
Electron transport layer (ETL) 3,
Active i-Double-layer system 4P-TPD:C60/DCV6T:C60 4, 5,
p-doped hole transport layer (HTL) 6,
Passivation layer (molybdenum oxide) 8,
Top contact (e.g. Gold) 9.

In a further exemplary embodiment, the photoactive component according to the invention has the following layer order:
"without metal oxide" (reference sample according to the prior art):
Glass/ITO/charge transport layer 1/charge transport layer 2/absorber mixed layer/charge transport layer 3/charge transport layer 4/aluminum.
"with metal oxide" (exemplary embodiment according to the invention):
Glass/ITO/charge transport layer 1/charge transport layer 2/absorber mixed layer/charge transport layer 3/charge transport layer 4/metal oxide/Aluminum.

Figure 5:
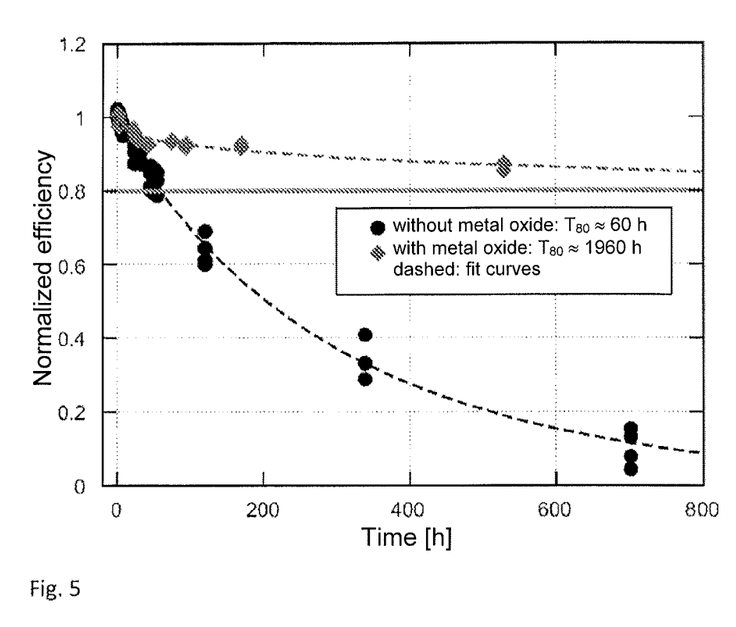
FIG. 5 shows an illustration of the stability curves of a component according to the invention comprising a passivation layer in comparison with a photoactive component according to the prior art.

Associated FIG. 5 illustrates the stability curves over time of the photoactive components with and without a passivation layer composed of a metal oxide. As can be gathered from FIG. 5, the photoactive components with a passivation layer have a longer lifetime.

LIST OF REFERENCE SYMBOLS

1 Substrate
2 Bottom contact (electrode)
3 Electron transport layer (ETL)
4 Active i-double-layer system 1
  Active i-double-layer system 2
6 p-Doped hole transport layer (HTL)
7 Cavity layer system
8 Passivation layer
9 Top contact (Electrode)
10 Electrode
11 Substrate
12 Electrode
13 HTL or ETL layer system
14 Absorber mixed layer 1
15 Absorber mixed layer 2
16 HTL or ETL layer system 17 Passivation layer
18 Electrode
19 Path of the incident light

What is claimed is:

1. An organic single, tandem or multiple solar cell comprising two electrodes,
wherein one electrode is arranged on a substrate and one electrode is arranged as a top counterelectrode and between the two electrodes there is at least one structure comprising a photoactive layer system based on an acceptor-donor-system, comprising nonpolymeric small molecules, and at least two partly doped or doped charge carrier transport layers, which are arranged between the electrode and the photoactive layer system, and between the top counterelectrode and the photoactive layer system, and further a passivation layer essentially consisting of non-doped molybdenum oxide, which is arranged between the photoactive layer system and the top counterelectrode, and
wherein the passivation layer directly adjoins to said partly doped or doped charge carrier transport layer, and wherein the passivation layer directly adjoins the top counterelectrode,
wherein the top counterelectrode is comprised of a material selected from a group consisting of Ag, Al, ITO, ZnO, ZnO:Al, and a combination of two or more of the aforementioned materials, and
wherein the passivation layer is a barrier to oxygen and moisture.

2. A component comprising the organic solar cell according to claim 1, wherein the component is a pin-single, pin-tandem cell, pin-multiple cell, nip single cell, nip-tandem cell or nip-multiple cell.

3. A component comprising the organic solar cell according to claim 1, wherein the component consists of a combination of nip, ni, ip, pnip, pni, pip, nipn, nin, ipn, pnipn, pnin or pipn-structures, in which a plurality of independent combinations containing at least one i-layer are stacked one above another.

4. A component comprising the organic solar cell according to claim 1, comprising a layer system that includes layers, wherein the layers of the layer system of the component are embodied as a light trap that lengthens the optical path of the incident light.

5. The organic solar cell according to claim 1, wherein the organic solar cell is arranged on flexible carrier materials for arrangement on curved or flexible carrier surfaces.

6. A component comprising the organic solar cell according to claim 1, the component comprising organic layers that consist at least partly of small molecules, at least partly of polymers or of a combination of small molecules and polymers.

7. A component comprising the organic solar cell according to claim 1, wherein the component is semitransparent at least in a certain light wavelength range.

8. A device in which the organic solar cell according to claim 1 is positioned on a planar, a curved or a flexible carrier surface.

9. The organic solar cell according to claim 1, further comprising at least one cavity layer system comprised of at least one doped, partly doped or undoped metal oxide layer.

10. The organic solar cell according to claim 9, wherein the cavity layer system is selected to be transparent to some wavelengths to alter the optical field distribution in a wavelength-dependent manner.

11. The organic solar cell according to claim 1, wherein the non-polymeric small molecules have monodisperse molar masses in the range 100 to 2000.

12. The organic solar cell according to claim 1, wherein at least one cavity layer system is furthermore arranged within at least one of the cells or at least between two adjacent cells, and alters the optical field distribution within the component.

13. The organic solar cell according to claim 1, wherein the doped charge carrier transport is a wide-gap doped charge carrier transport.

14. An organic single, tandem or multiple solar cell comprising two electrodes, wherein one electrode is arranged on a substrate and one electrode is arranged as a top counterelectrode and between the two electrodes there is at least one structure comprising a photoactive layer system, and at least two partly doped or doped charge carrier transport layers, which are arranged between the electrode and the photoactive layer system, and between the top counterelectrode and the photoactive layer system, and further a passivation layer essentially consisting of non-doped molybdenum oxide, which is arranged between the photoactive layer system and the top counterelectrode, and
wherein the passivation layer directly adjoins to said partly doped or doped charge carrier transport layer, and
wherein the passivation layer directly adjoins the top counterelectrode,
wherein the top counterelectrode is made of a material selected from a group consisting of Ag, Al, ITO, ZnO, ZnO:Al, and a combination of two or more of the aforementioned materials, and
wherein the passivation layer is a barrier to oxygen and moisture.

15. An organic single, tandem or multiple solar cell comprising two electrodes,
a) wherein one electrode is arranged on a substrate and one electrode is arranged as a top counter electrode and
b) at least one structure between the two electrodes and comprising a photoactive layer system, and at least two partly doped or doped charged carrier transport layers, which are arranged between the electrode and the photoactive layer system, and between the top counter electrode and the photoactive layer system,
c) and a passivation layer essentially consisting of non-doped molybdenum oxide to increase the lifetime of the organic single, tandem or multiple solar cell, which is arranged between the top counter electrode and the photoactive layer system, wherein the passivation layer directly adjoins to said partly doped or doped charge carrier transport layer, and wherein the passivation layer directly adjoins to the top counter electrode, and is a barrier to oxygen and moisture, and
d) wherein the top counter electrode comprises a material selected from a group consisting of Ag, Al, ITO, ZnO, ZnO:Al, and a combination of two or more of the aforementioned materials.

* * * * *